(12) United States Patent
Sutardja

(10) Patent No.: US 6,380,772 B1
(45) Date of Patent: Apr. 30, 2002

(54) SELF-LIMITING PAD DRIVER

(75) Inventor: Sehat Sutardja, Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/746,687

(22) Filed: Dec. 22, 2000

Related U.S. Application Data

(60) Provisional application No. 60/204,886, filed on May 17, 2000.

(51) Int. Cl.$^7$ ................................................. H03B 1/00
(52) U.S. Cl. ....................................... 327/112; 327/108
(58) Field of Search ................................. 327/108, 112, 327/379, 109, 111, 170, 309, 310; 326/27, 30, 21, 83, 85, 86, 87

(56) References Cited

U.S. PATENT DOCUMENTS

| | | | | |
|---|---|---|---|---|
| 4,952,818 A | * | 8/1990 | Erdelyi et al. | 327/108 |
| 4,959,561 A | * | 9/1990 | McDermott et al. | 327/108 |
| 5,023,488 A | | 6/1991 | Gunning | 326/86 |
| 5,132,564 A | | 7/1992 | Fletcher et al. | 326/30 |
| 5,485,107 A | | 1/1996 | Lacey et al. | 326/86 |
| 5,708,386 A | * | 1/1998 | Chow | 327/380 |
| 5,777,497 A | * | 7/1998 | Han | 327/108 |
| 5,818,260 A | | 10/1998 | Kuo | 326/86 |
| 5,973,512 A | * | 10/1999 | Baker | 326/87 |
| 6,081,134 A | | 6/2000 | Labram | 326/83 |
| 6,157,233 A | * | 12/2000 | Blake | 327/108 |

* cited by examiner

Primary Examiner—Matthew Smith
Assistant Examiner—Paul Dinh
(74) Attorney, Agent, or Firm—Eric B. Janofsky

(57) ABSTRACT

A complementary self-limiting transmission line driver is capable of driving an unterminated line driver with self-limiting slew rate control to minimize the effects of reflections on the transmission line and minimize the level of noise on power supply distribution paths. The complementary self-limiting driver circuit includes a driving circuit for receiving an output signal. In response to the output signal, a driving signal is provided to an output terminal connected to the unterminated transmission line. A first limiting circuit is connected to the driving means for controlling a slew rate of the driving means and for disabling the driving means when the output signal approaches within a threshold level of the second signal level. A second limiting circuit is optionally connected to the driving means for controlling the slew rate of the driving means and for disabling the driving means when the output signal approaches within a threshold level of the first signal level.

10 Claims, 14 Drawing Sheets

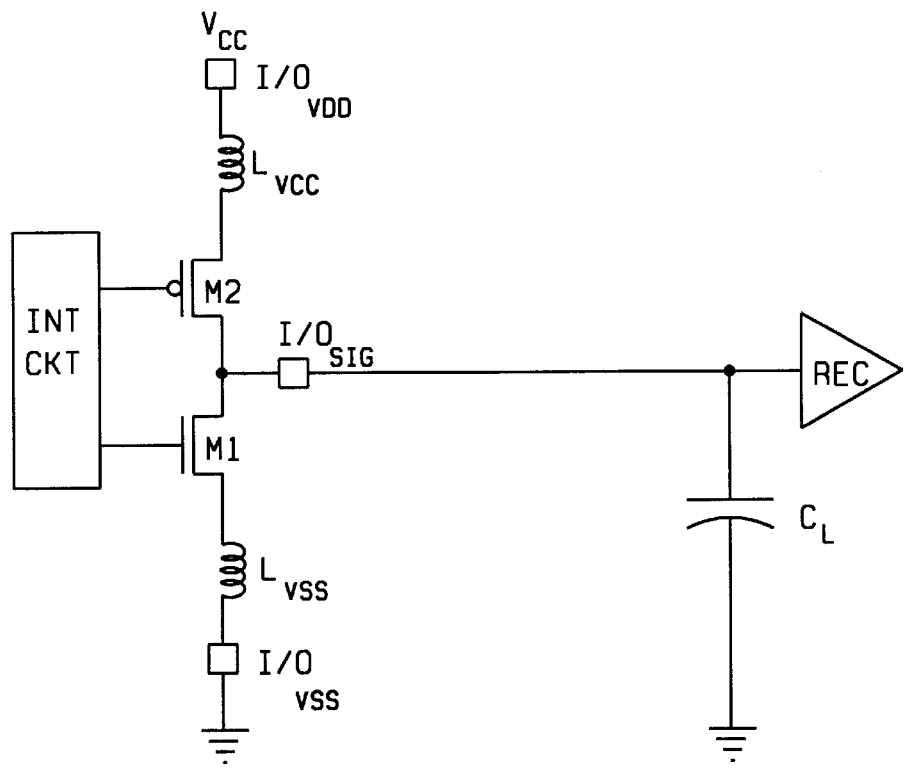
FIG. 1 - Prior Art
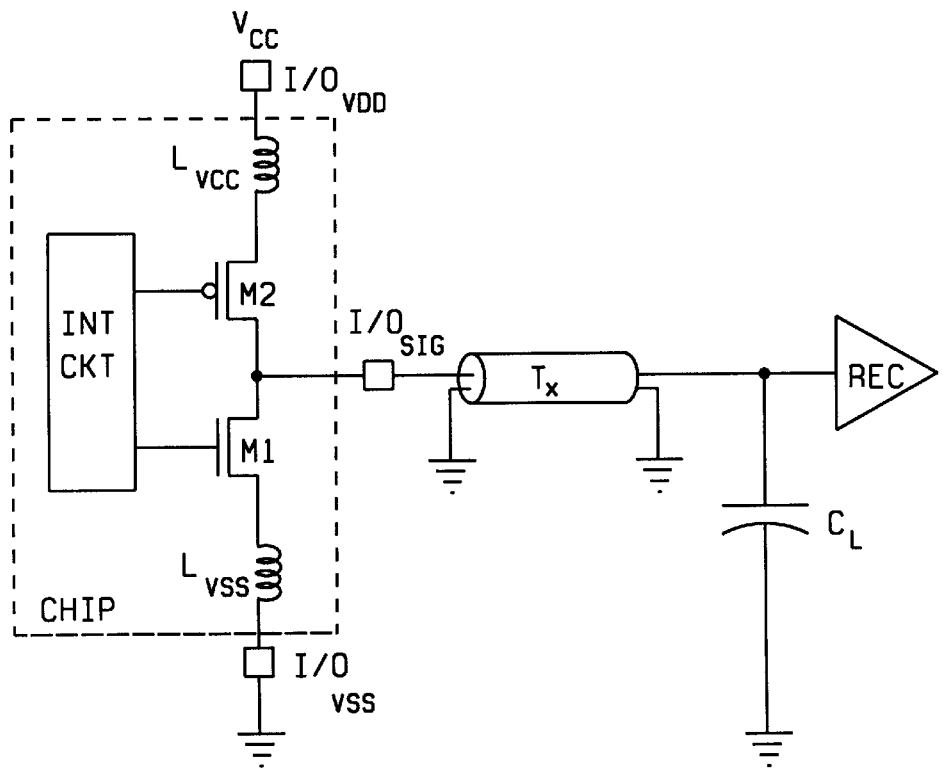
FIG. 2 - Prior Art

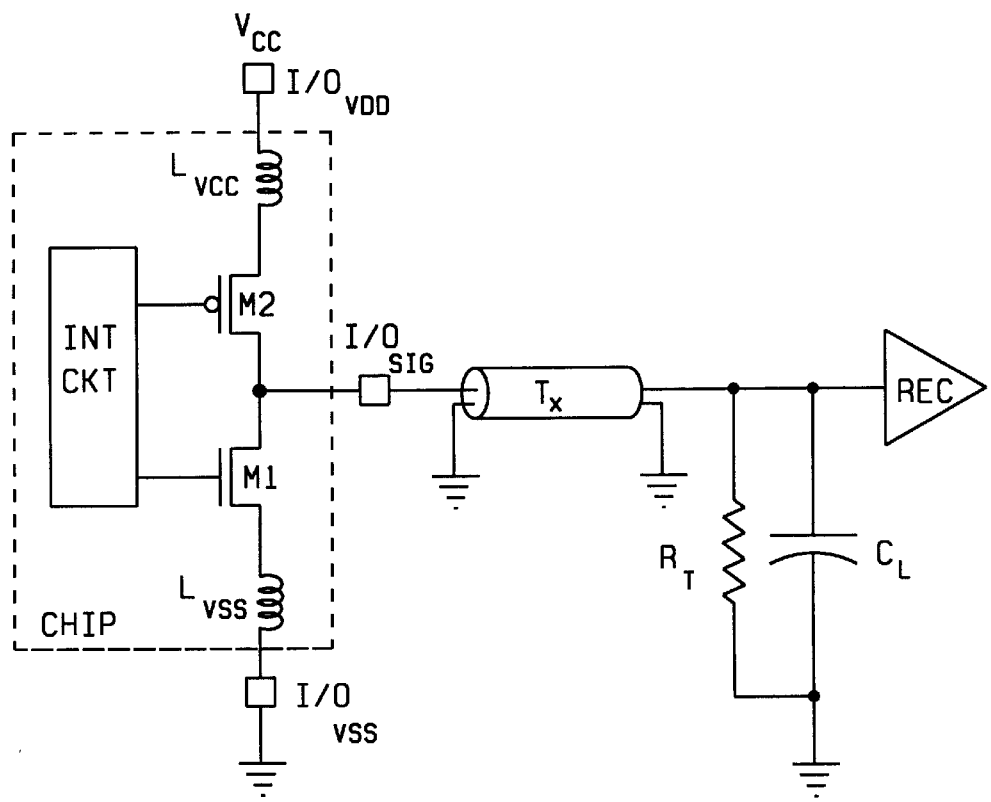
FIG. 3 - Prior Art

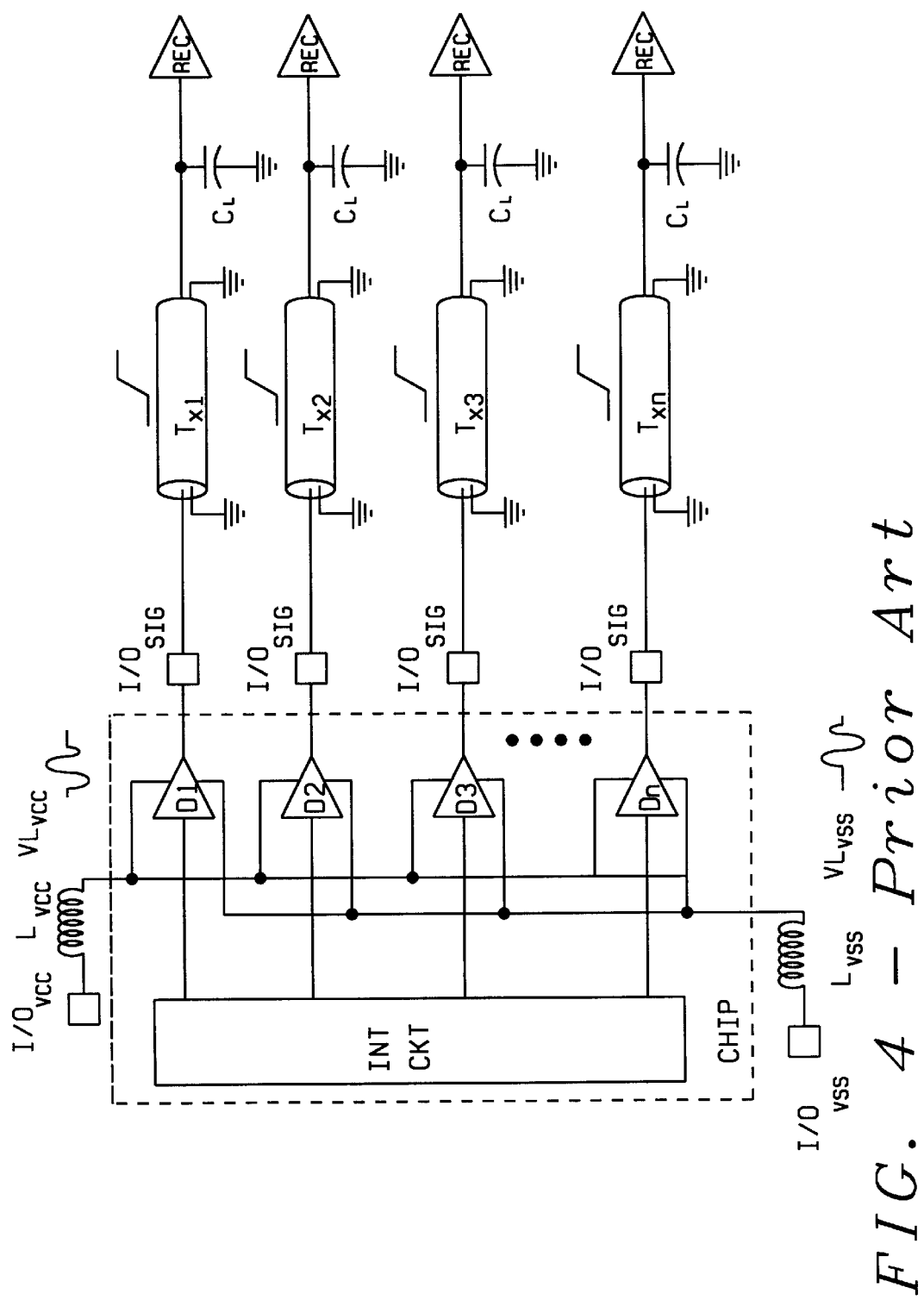
FIG. 4 – Prior Art

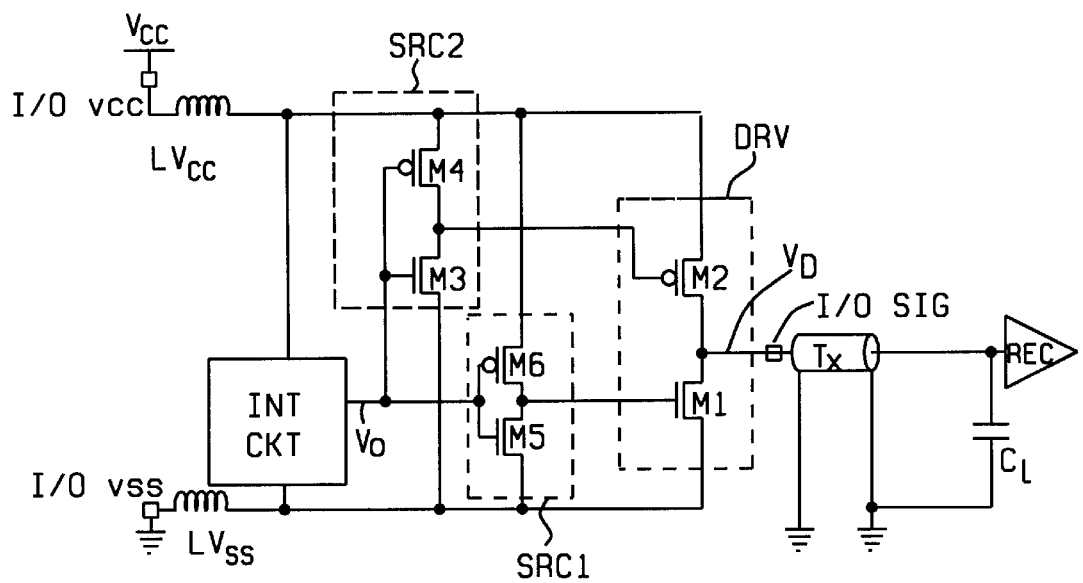
*FIG. 5 - Prior Art*
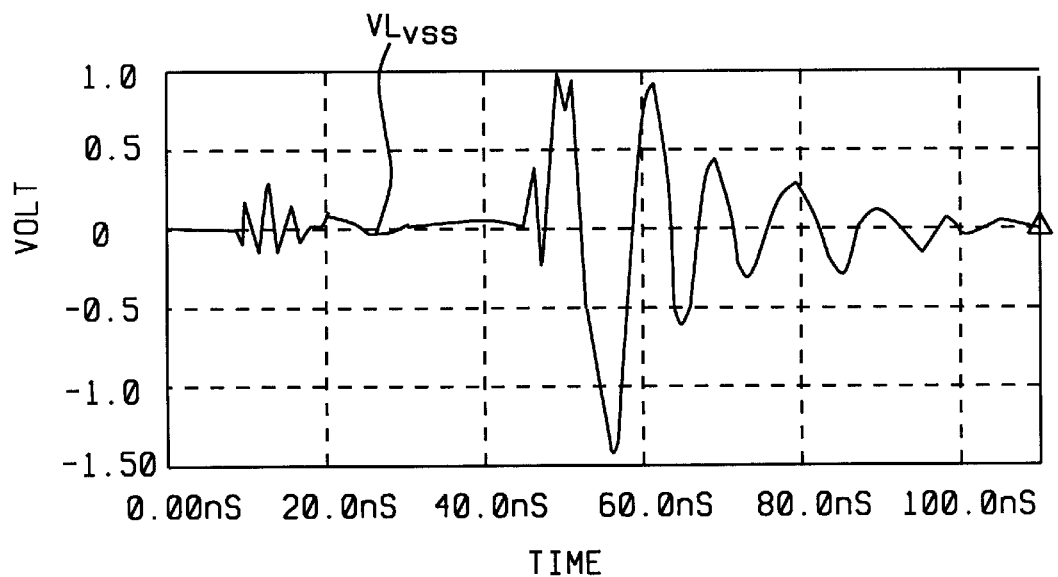
*FIG. 6a - Prior Art*

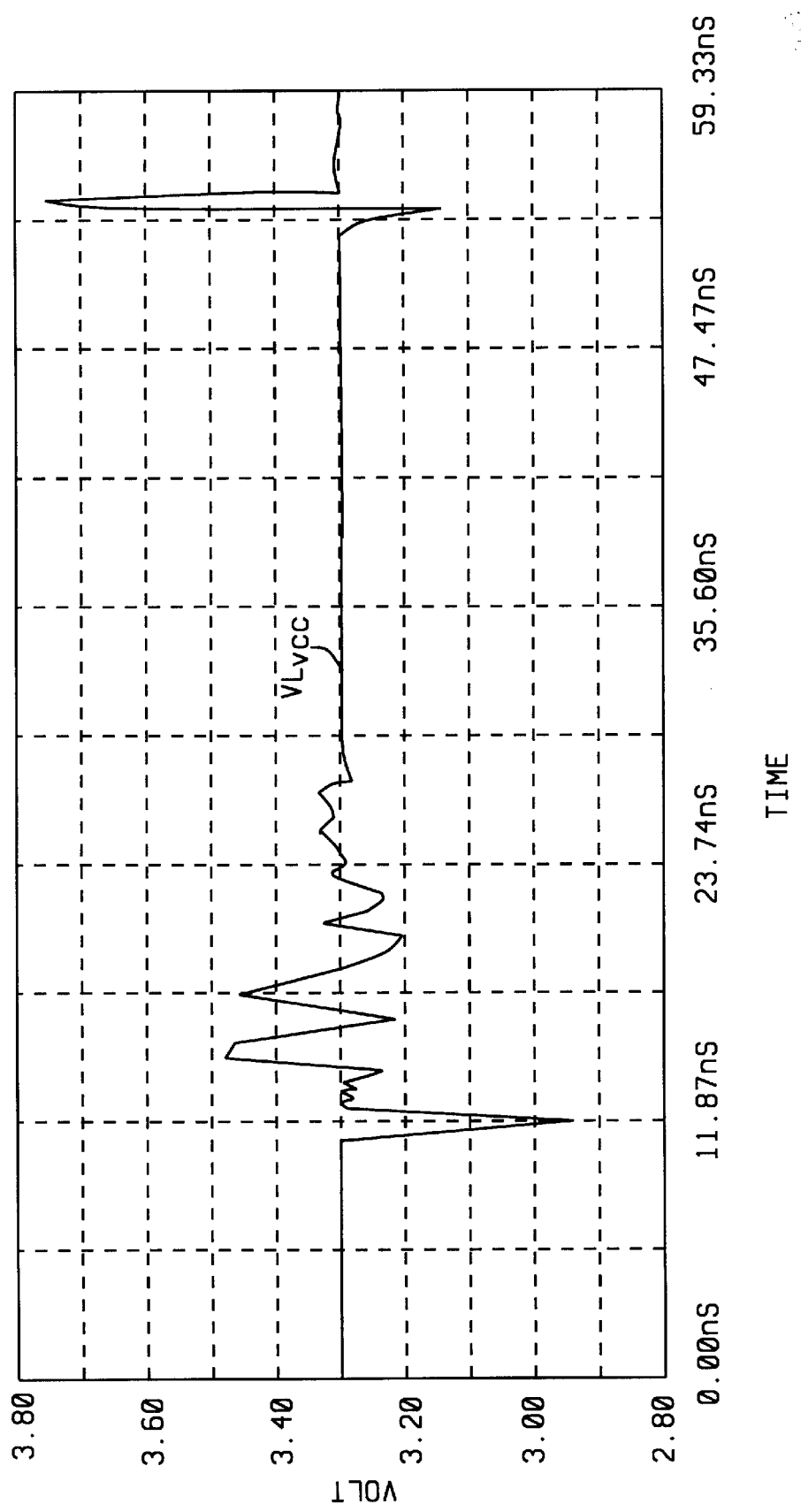
FIG. 6b – Prior Art

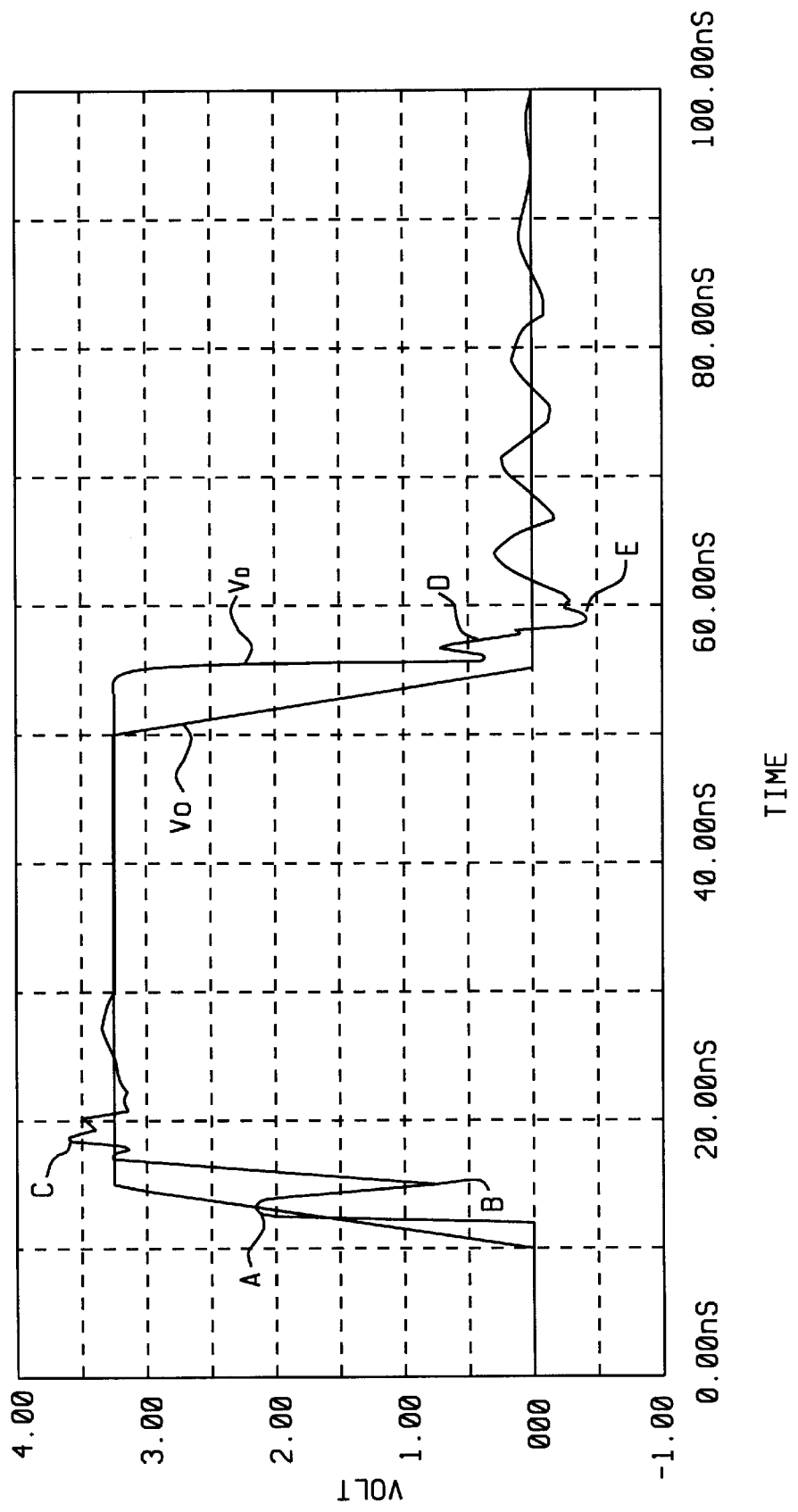
FIG. 7 – Prior Art

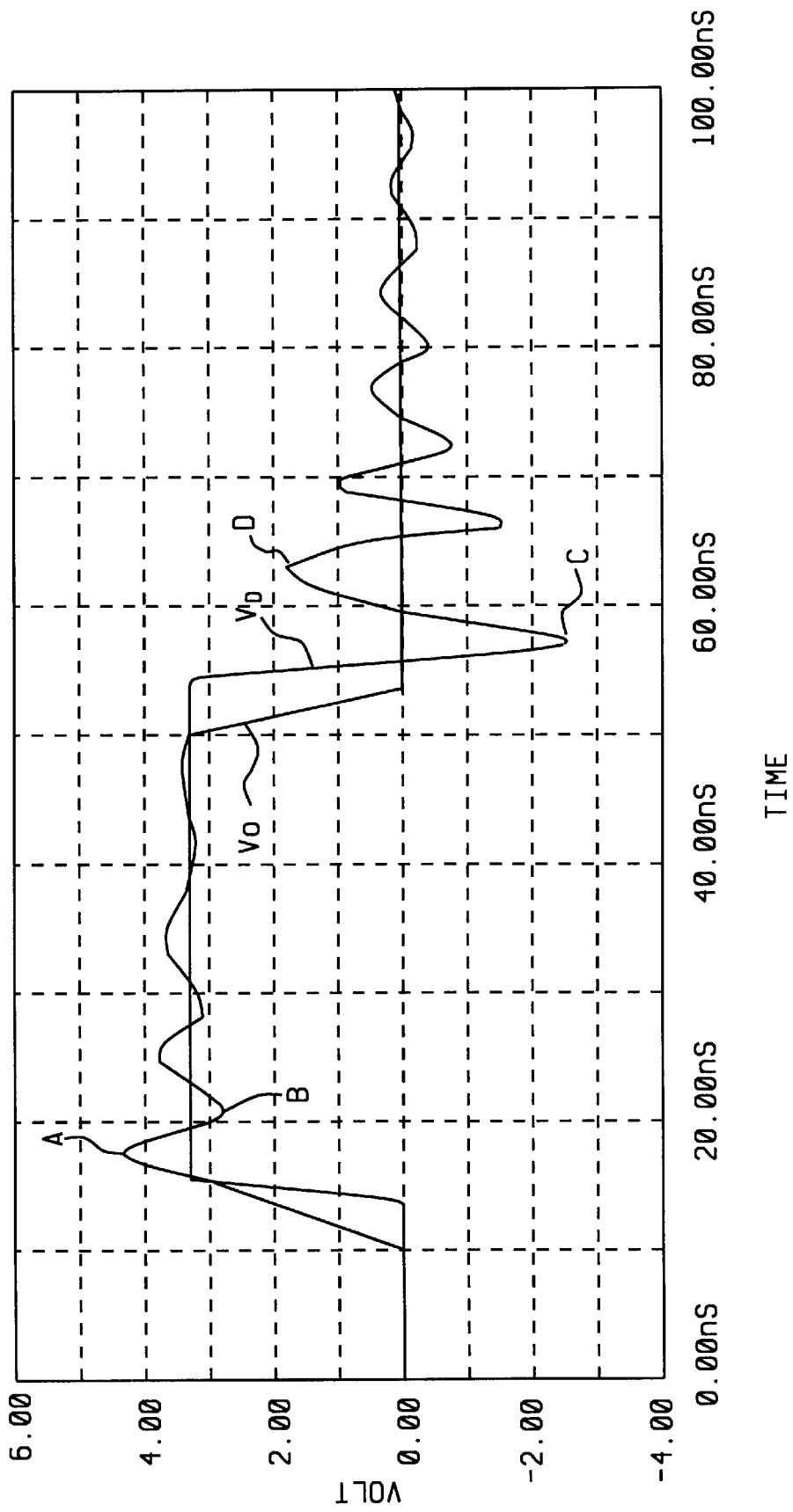
FIG. 8 – Prior Art

SELF-LIMITING PAD DRIVER

CROSS REFERENCE TO RELATED APPLICATION

The present invention claims priority under 35 U.S.C. §119 (e) from U.S. provisional application Ser. No. 60/204,886, entitled "A Self-Limiting Pad Driver," filed May 17, 2000, the contents of which are incorporated herein by reference.

BACKGROUND OF THE INVENTION

1. Field of the Invention

This invention relates to circuits to transfer digital signals to a transmission line connecting two integrated circuits. More particularly, this invention relates to circuits that transfer digital signals to an unterminated transmission line while limiting the effects of reflections and noise on power distribution lines.

2. Description of the Related Art

Driver and receiver circuits for the transfer of digital signals between functions of an electronic or computer system are well known in the art. Bus structures such as the Integrated Drive Electronics (IDE) specified in the American National Standards Institute (ANSI) standard X3T10 describe the electrical power and data interface between a computer system board (motherboard) and an integrated disk controller. Generally these driver circuits consist of transistors configured to transfer signals from internal function circuits of the integrated circuit and to condition the signals to be transferred and to transfer the signals to an input/output pad formed at the surface of a semiconductor substrate on which the integrated circuit is formed. Attached to the input/output pad is wirebond. The wirebond is formed of a fine wire connected to the input/output pad at one end and connected to a wire trace that is formed into a bonding pad on a module on which the semiconductor die is mounted at the opposite end of the bonding wire. The wirebond allows the signal further transferred to printed wiring traces on the module. The printed wiring traces of the module are connected to terminal pins of the module. The terminal pins of the module allow the module to be mounted to a printed circuit board (the motherboard or the integrated disk controller). The pins are either connected through vias (holes in the printed circuit board) or in contact with pads formed of printed wiring traces on the surface of the printed circuit board. The pins will be generally soldered to the vias or the contact pads of the printed circuit board. The vias or contact pads are connected to printed wiring traces that conduct the signals from the integrated circuit to other integrated circuits mounted similarly to the printed circuit board. Alternately, the printed wiring traces will be connected to the terminating connector pins of one end of a cable connected to the printed circuit wiring board. The cable has a second terminating connector connected at the opposite end, which is connected to a second printed circuit wiring board. The cable then transfers the signal from the integrated circuit to printed wiring traces on the second printed circuit board. The wiring traces on the second printed circuit wiring board are connected to the vias or bonding pads having the pins of a second integrated circuit module. The pins of the second integrated circuit module are connected through module wiring traces to the module bonding pads. Wirebonds connect the module bonding pads to an input/output pad on a second semiconductor substrate having a second integrated circuit. The input/output pad is connected by interconnecting layers on the surface of the semiconductor substrate to a receiver. The receiver accepts the transferred signal and conditions it for use by the internal circuits of the second integrated circuit.

At lower frequencies, the equivalent circuit of one such signal path to transfer signals between integrated circuit functions on separate printed circuit boards is as shown in FIG. 1. The output driver is formed of the n-type metal oxide semiconductor (MOS) transistor M1 and the p-type MOS transistor M2. The drains of the n-type MOS transistor M1 and the p-type MOS transistor M2 are connected through the I/O signal pad to the load capacitor $C_L$. The load capacitor $C_L$ is composed of the capacitances of the input/output pads on the semiconductor substrate mounted in the second integrated circuit module, wirebond from the input/output pad, the module wiring trace of the second integrated circuit module, module pins of the second integrated circuit module, printed circuit wiring traces of the printed circuit boards, the terminal connectors that attach a cable to the printed circuit boards, the distributed capacitance of the inter-connecting cable, and the input loading capacitance of the receiver.

The source of the n-type MOS transistor M1 is connected through the parasitic inductance $L_{V_{ss}}$ and the pad connector $I/O_{V_{ss}}$ to the ground reference potential. The parasitic inductance $L_{V_{ss}}$ is the lumped inductance of a wirebond from voltage wirebonding pad of the integrated circuit to the module pin, the module pin itself, and any of the printed circuit wiring traces, connectors, and cabling connecting the ground reference potential to the integrated circuit.

The source of the p-type MOS transistor M2 is similarly connected through the parasitic inductance $L_{V_{cc}}$ and the pad connector $I/O_{V_{ss}}$ to the power supply voltage source $V_{cc}$. The parasitic inductance $L_{V_{cc}}$ is the lumped inductance of the wirebond from the integrated circuit to the module pin of the module containing the integrated circuit, the module pin itself, and any of the printed circuit wiring traces, connectors, and cabling connecting the power supply voltage source to the integrated circuit.

The gates of the n-type MOS transistor M1 and the p-type MOS transistor M2 are connected to the internal circuit Int Ckt of the integrated circuit to receive the output signal that is to be transferred to the receiver REC. When the output signal changes from a first voltage level (i.e. 0V) to a second voltage level, (i.e. $V_{cc}$) the n-type MOS transistor M1 conducts and the p-type MOS transistor M2 ceases to conduct. Any charge present on the load capacitor CL is conducted through the n-type MOS transistor M1 to the ground reference potential.

Similarly, when the output signal traverses from the second voltage level ($V_{cc}$) to the first voltage level, the n-type MOS transistor M1 ceases to conduct and the p-type MOS transistor M2 conducts. A current is transferred from the power supply voltage source through the p-type MOS transistor M2 to charge the load capacitor $C_L$.

At shorter physical dimensions and at lower frequencies with slower transition times, the schematic of FIG. 1 is adequate to simulate the performance of the interface. However, as the dimensions increase or the frequency of operation increases, a more accurate model, as shown in FIG. 2, must be used. In FIG. 2, the drains of the n-type MOS transistor M1 and the p-type MOS transistor M2 are connected to the transmission line $T_X$ through the input/output signal pad. The opposite end of the transmission line $T_X$ is connected to the load capacitor $C_L$. The load capacitor $C_L$ now represents the lumped capacitance of the terminating pins of the second connector of the cable, the printed circuit wiring traces, the module pins of the second integrated circuit module, the printed wiring traces of the second integrated circuit module, the bonding wire connected to the receiver REC and the input capacitance of the receiver REC itself. The current return lines of the transmission are connected to the ground reference potential.

The transmission line effects of the driver providing or sourcing current or receiving or sinking current from an open circuit produces predictable but undesirable effects to the driver signal placed on the transmission line. The effects or reflections often cause "ringing" or self-oscillation of the driver signal during the transitions between the first voltage level (0V) and the second voltage level ($V_{cc}$).

FIG. 3 shows the addition of a terminating resistor $R_T$ from the junction of the transmission line $T_X$ and the receiver to the ground reference potential. In this example, when the output signal $V_O$ is at the second voltage level, the p-type MOS transistor must remain conducting to keep the input of the receiver at the second voltage level ($V_{cc}$).

It is well known in the art that the terminating resistor $R_T$ can be placed from the junction of the transmission line and the input of the receiver to the power supply voltage source $V_{cc}$. Further, the terminating resistor may be a network of resistors connected to both the ground reference potential and the power supply voltage source $V_{cc}$.

The terminating resistor $R_T$ eliminates or reduces any of the noise effect due to reflections on the transmission line. Any remaining reflections are due to discontinuities in the signal path due to factors such as the terminating pins of the connectors that attach the printed circuit boards to the cable forming the transmission line.

Refer now to FIG. 4 to examine a communication interface that is made up of multiple signal paths similar to FIG. 2. In the IDE standard, the interface consists of sixteen data bits or data paths.

The interface has multiple drivers $D_1, D_2, D_3, \ldots, D_n$, each connected through an input/output signal pad to a transmission line $T_{x1}, T_{x2}, T_{x3}, T_{xn}$. As described above, each transmission line is connected to a receiver. The load capacitance $C_L$, as described above, is the wiring trace capacitance, the terminating connector capacitance, and the input capacitance of the receiver.

Each driver is configured as shown in FIG. 2. When the output signal $V_O$ is such that the n-type MOS transistor M1 is turned on and the p-type MOS transistor M2 is turned off, as described above, the charge present on the load capacitance $C_L$ is discharged through the parasitic inductor $L_{Vss}$. The voltage $V_{LVss}$ developed across the parasitic inductor $L_{Vss}$ is proportional to the change in current resulting from the activation of the n-type MOS transistor M1. If any or all of the drivers of the communication interface have their n-type MOS transistors M1 activated, the resulting currents are added, thus increasing the level of noise or "ground bounce" on the distribution path for the ground reference potential. This "ground bounce," also referred to as $\Delta i$ noise, impacts the operation of the internal circuits as well as the drivers of the communication interface.

Alternately, when the output signal $V_O$ is such that p-type MOS transistor M2 is turned on and the n-type MOS transistor M1 is turned off, the load capacitance $C_L$ is now charged by a current from the power supply voltage source $V_{cc}$ through the parasitic inductor $L_{Vcc}$. The voltage $V_{LVcc}$ across the parasitic inductor $L_{Vcc}$ is proportional to the change in the charging current flowing to the load capacitance $C_L$ through the p-type MOS transistor M2. If any or all the drivers have their p-type MOS transistors activated, the resulting currents are added, thus increasing the level of noise or power supply "bounce" (again $\Delta i$ noise) on the distribution path for the power supply voltage source. The power supply "bounce" or noise also affects the operation of the internal circuits as well as the drivers of the communication interface.

In order to minimize the effect of a very fast rise time on the transfer of the driver signal on the transmission line, the slew rate of the driver as measured in volts/second is lowered. It is well known in the art that if the electrical length of the transmission line $T_X$ is less than one half the rise time or fall time of the driver signal, then the transmission can be considered capacitive and included in the load capacitance $C_L$ as shown in FIG. 1.

FIG. 5 shows a complementary driving circuit of the prior art with slew rate control. The driver circuit DRV is connected to the transmission line $T_X$ as described in FIG. 2. The slew rate control predrivers $SRC_1$ and $SRC_2$ are connected to the driver circuit to control the activation of the driver circuit when the output signal $V_O$ indicates that the driver signal $V_D$ is to change between the first voltage level (0V) and the second voltage level ($V_{cc}$). The first and second slew rate control predrivers respectively consist of the n-type MOS transistors M3 and M5 and the p-type MOS transistors M4 and M6. The drains of the n-type MOS transistor M5 and the p-type MOS transistor M6 are connected to the gate of the n-type MOS transistor M1. The drains of the n-type MOS transistor M3 and the p-type MOS transistor M4 are connected to the gate of the p-type MOS transistor M2. The gates of the n-type MOS transistors M3 and M5 and the p-type MOS transistors M4 and M6 are connected to the internal circuits to receive the output signal. The sources of the n-type MOS transistors M3 and M5 are connected to the ground reference potential through the parasitic inductance $L_{VSS}$ and the voltage wirebonding pad $I/O_{VSS}$. The sources of the p-type MOS transistors M4 and M6 are connected through the parasitic inductance $L_{VCC}$ and the voltage wirebonding pad $I/O_{VCC}$ to the power supply voltage source.

An example of a conventional slew rate control is provided in U.S. Pat. No. 6,081,134, the contents of which are incorporated herein by reference.

FIG. 6a illustrates the "ground bounce" or the voltage $VL_{Vss}$ across the parasitic inductor $L_{Vss}$ of FIG. 5. As is shown, the voltage $VL_{Vss}$ across the parasitic inductor $L_{Vss}$ can change by approximately 2.5V when the driver signal $V_D$ is changing from the second voltage level ($V_{cc}$) to the first voltage level (0V) and the load capacitance $C_L$ is being discharged.

Conversely, FIG. 6b illustrates the power supply "bounce" or the voltage developed across the parasitic inductor $L_{Vcc}$ of FIG. 5. In this case, the voltage $VL_{Vcc}$ can change by approximately 600 mV when the driver signal changes from the first voltage level (0V) to the second voltage level ($V_{cc}$) and the load capacitance $C_L$ is being charged.

This noise is super-positionally added when the driver signal of multiple drivers, as shown in FIG. 4, are simultaneously traversing between the first voltage level (0V) and the second voltage level ($V_{cc}$).

Refer now to FIG. 7 to discuss the voltage at the near end or transmitter end of the transmission line. The output signal $V_O$ is transmitted to the slew rate control drivers $SRC_1$ and $SRC_2$ of FIG. 5. In response to the output signal $V_O$, the output driver DRV generates the driver signal $V_D$. The point A on the driver signal $V_D$ shows the voltage of the driver signal $V_D$ at the beginning of the transmission down the transmission line $T_x$. The voltage at point A on the driver signal $V_D$ is the voltage divider of the characteristic impedance $Z_0$ of the transmission line $T_x$ and the voltage drop across the p-type MOS transistor M2. The voltage at point B on the driver signal $V_D$ is the result of the reflection from the load capacitance $C_L$. As can be seen, the voltage at the drain of the p-type MOS transistor M2 can become negative, causing a large instantaneous current flow from the power supply voltage source $V_{cc}$. The voltage returns at point C on the driver signal $V_D$ to the voltage level of the power supply voltage source $V_{cc}$ with modest "ringing" or damped self-oscillation.

When the output signal $V_D$ changes from the second voltage level ($V_{cc}$) to the first voltage level (0V), the driver signal $V_D$ falls to the voltage level at point D. This again is a result of the voltage divider between the driver, in this case, the n-type MOS transistor M1 and the impedance of the transmission line $T_x$. The returning reflections cause the "ringing" or damped self-oscillation as seen in point E on the driver signal $V_D$.

Refer now to FIG. 8 to review the voltage levels at the far end of the transmission line $T_x$ at the input of the receiver. The output signal $V_O$ is, as described above, transferred from the internal circuits to the slew rate control predrivers $SRC_1$ and $SRC_2$. In response to the output signal $V_O$ the driver signal $V_D$ at the receiver is as shown. The arrival of the incident wave of the driver signal at the load capacitance $C_L$, which appears as an open circuit. The driver signal level $V_D$ is doubled to the voltage level at point A on the driver signal $V_D$. Subsequent reflections cause the "ringing" or damped self-oscillation shown at point B on the driver signal $V_D$.

When the output signal traverses from the second voltage level ($V_{cc}$) to the first voltage level (0V), the incident wave of the driver signal $V_D$ is transmitted down the transmission line to arrive at the load capacitance. The voltage level a point D on the driver signal $V_D$ of FIG. 7 is doubled and the voltage level of point C on the driver signal $V_D$ of FIG. 8 is achieved. The attendant reflections cause the "ringing" or damped self-oscillation shown at point D on the driver signal $V_D$ of FIG. 8.

If the frequency transmitted as the output of the internal circuit is sufficiently high and the slew rate sufficiently large, the "ringing" or damped self-oscillation on the transmission line and the noise on the power supply distribution interconnections is sufficiently large to prevent the receiving of the digital data. The classic IDE standard has a maximum transmission rate of 8 MHz. However, as the system design has improved, it is desirable to transmit the data at 16 MHz without the "ringing" or damped self-oscillation and the power distribution noise.

SUMMARY OF THE INVENTION

In accordance with an aspect of the present invention, a complementary self-limiting driver circuit within an integrated circuit for driving unterminated transmission lines includes a driving circuit for receiving an output signal that is changing from a first signal level (0V) to a second signal level, and after a period of time, is changing from the second signal level (approximately $V_{cc}$) to the first signal level. In response to the output signal, a driving signal is provided to an output terminal connected to the unterminated transmission line. A first limiting circuit is connected to the driving means for controlling a slew rate of the driving means when the driver signal is changing from the first signal level to the second signal level and for disabling the driving means when the output signal approaches within a threshold level of the second signal level. A second limiting circuit is optionally connected to the driving means for controlling the slew rate of the driving means when the driver signal is changing from the second signal level to the first signal level and for disabling the driving means when the output signal approaches within a threshold level of the first signal level.

The driving circuit has a first transistor of a first conductivity type. The first transistor of a first conductivity type has a first terminal connected to receive the output signal, a second terminal connected to the output terminal for providing the output signal during the changing from the first signal level to the second signal level, and a third terminal connected to a reference voltage source. The driving circuit also has a first transistor of a second conductivity type. The first transistor of a second conductivity type has a first terminal connected to receive the output signal, a second terminal connected to the output terminal for providing the output signal during the changing from the second signal level to the first signal level, and a third terminal connected to a power supply voltage source.

The first limiting circuit is composed of a second transistor of the first conductivity type. The second transistor of the first conductivity type has a first terminal connected to the driving means, a second terminal connected to the internal circuits to receive the output signal, and a third terminal connected to the reference voltage source. The first limiting circuit has a second transistor of the second conductivity type. The second transistor of the second conductivity type has a first terminal connected to the output terminal, a second terminal connected to the internal circuits to receive the output signal, and a third terminal connected to the first terminal of the second transistor of the first conductivity type and to the driving means such that when the output signal activates the driving means, the driving means is functioning as a diode until the driver signal achieves a signal level within the threshold of the first signal level at which time the driving means is disabled.

The second optional limiting circuit is composed of a third transistor of the second conductivity type. The third transistor of the second conductivity type has a first terminal connected to the driving means, a second terminal connected to the internal circuits to receive the output signal, and a third terminal connected to the power supply voltage source, The second limiting circuit also has a third transistor of the first conductivity type. The third transistor of the first conductivity type has a first terminal connected to the output terminal, a second terminal connected to the internal circuits to receive the output signal, and a third terminal connected to the first terminal of the third transistor of the second conductivity type and to the driving means such that when the output signal activates the driving means, the driving means is functioning as a diode until the driver signal achieves a signal level within the threshold of the second signal level at which time the driving means is disabled.

In order to provide a D.C current level necessary for terminated transmission lines or for receiver requiring a minimum current level, The complementary self-limiting driver circuit further includes a current driving means connected in parallel with the driving circuit. The current driving means also receives the output signal from the internal circuits and in response to the output signal provides a path to source and sink current from the output terminal.

For communication interfaces having a higher voltage level than can be tolerated by the transistors of the complementary self-limiting driver circuit, a cascode driving circuit is placed between the driving means and the output terminal. The cascode driving circuit restricts a high voltage present at the output terminal from contacting the driving means and damaging the driving means. The cascode driving means is formed of a fourth transistor of the first conductivity type, and a fourth transistor of the second conductivity type. The fourth transistor of the first conductivity type has a first terminal connected to the output terminal, a second terminal connected to the driving means, and a third terminal connected to a first biasing voltage source. The fourth transistor of the second conductivity type has a first terminal connected to the output terminal, a second terminal connected to the driving means, and a third terminal connected to a second biasing voltage source.

BRIEF DESCRIPTION OF THE DRAWINGS

FIG. 1 is a schematic diagram of a digital communication interface of the prior art showing an I/O pad driver and a model of the transmission line as a load capacitance.

FIG. 2 is a schematic diagram of a digital communication interface of the prior art showing an I/O pad driver and an unterminated transmission line.

FIG. 3 is a schematic diagram of a digital communication interface of the prior art showing a terminated transmission line.

FIG. 4 is a schematic diagram of a communication interface showing multiple data paths of the prior art.

FIG. 5 is a schematic diagram of a slew rate controlled driver on a communication interface of the prior art.

FIGS. 6a and 6b are plots, respectively, of switching noise on the ground reference potential ($V_{ss}$) and the power supply voltage source ($V_{cc}$) of the slew rate controlled driver of FIG. 5.

FIG. 7 is a plot of the output signal of the internal circuits and the driver signal at the near end of the transmission line of the slew rate controlled driver of FIG. 5.

FIG. 8 is a plot of the output signal of the internal circuits and the driver signal at the far end of the transmission line of the slew rate controlled driver of FIG. 5.

DETAILED DESCRIPTION OF THE INVENTION

Figure 9:
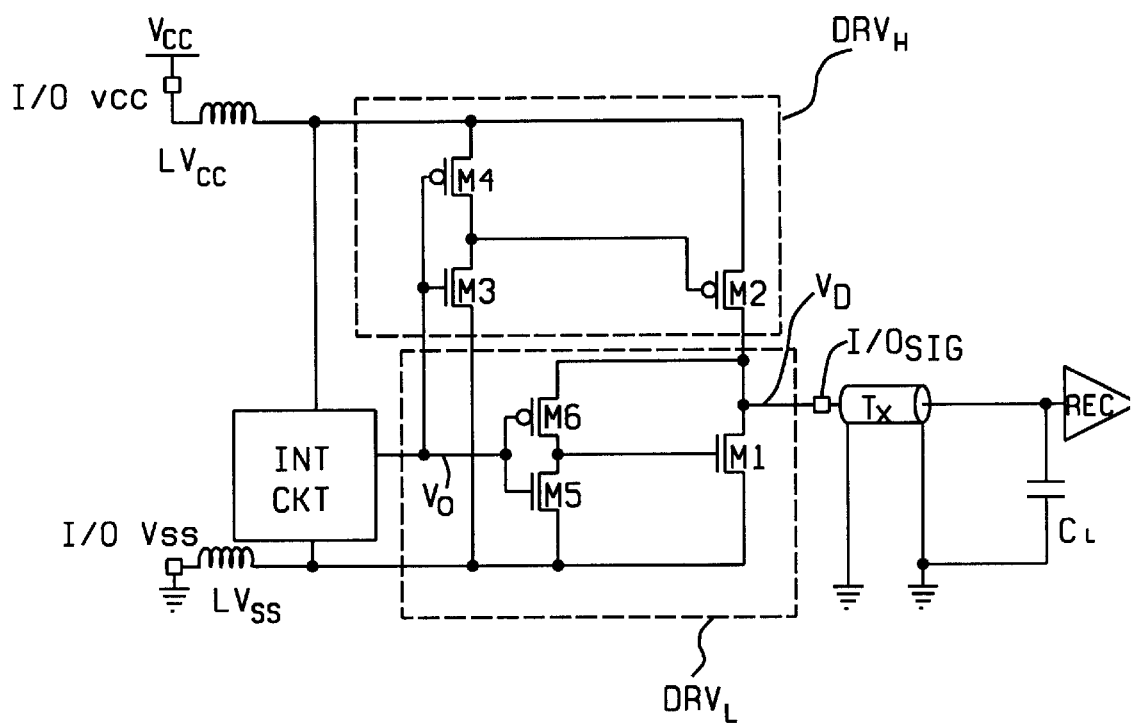
FIG. 9 is a schematic diagram of a communication interface containing a self-limiting driver of this invention.

A self-limiting driver of this invention is shown in FIG. 9 as implemented as a single bit or data path of a communication interface. As shown, the data path of the communication interface has two basic driver circuits $DRV_H$ and $DRV_L$ to form the complementary driver circuit of this invention. The basic driver circuit $DRV_H$ is what is commonly termed a "high side" driver that, when active, allows the load capacitance $C_L$ to charge toward the second voltage level $V_{cc}$ of the power supply voltage source $V_{cc}$. The logic level represented by the second voltage level ($V_{cc}$) is thus received by the receiver. The structure of the driver circuit $DRV_H$ may optionally disable the driver circuit $DRV_H$ when the voltage level at the output of the driver circuit $DRV_H$ approaches within a threshold voltage of the driver circuit $DRV_H$.

The basic driver circuit $DRV_L$ is what is commonly termed a "low side" driver that, when active, allows the load capacitance $C_L$ to discharge toward the first voltage level (0V) of the ground reference potential. The receiver thus receives the logic level represented by the first voltage level (0V). The structure of the driver circuit $DRV_L$ similarly disables the driver circuit $DRV_L$ when the voltage level at the output of the driver circuit $DRV_L$ is within a threshold voltage of the driver circuit $DRV_L$.

This disabling of the driver circuits $DRV_H$ and $DRV_L$ as they approach within their respective threshold voltage of the second and first voltage levels self-limits the slew rates of the driver circuits $DRV_H$ and $DRV_L$ and therefore minimizes the "ringing" or damped self-oscillation resulting from reflections on the transmission line $T_x$. Further, the disabling of the driver circuits $DRV_H$ and $DRV_L$ minimizes the magnitude of the $\Delta i$ noise generated on the distribution wiring and interconnection network for the power supply voltage source $V_{cc}$ and the ground reference potential.

The driver circuit $DRV_H$ is comprised of the p-type MOS transistors M2 and M4 and the n-type MOS transistor M3. The sources of the p-type MOS transistors M2 and M4 are connected through the distribution wiring and interconnection network modeled by the parasitic inductor $LV_{cc}$ to the power supply voltage source $V_{cc}$. The gates of the p-type MOS transistor M4 and the n-type MOS transistor M3 are connected together to form the input of the driver circuit $DRV_H$ which is connected to the internal circuits Int Ckt to receive the output signal $V_o$.

The drains of the p-type MOS transistor M4 and the n-type MOS transistor M3 are connected to the gate of the p-type MOS transistor M2. The source of the n-type MOS transistor M3 is connected to the ground reference potential. When the output signal $V_o$ of the internal circuits Int Ckt changes from the first voltage level (0V) to the second voltage level (5V), the n-type MOS transistor M3 is turned on and the p-type MOS transistor M4 is turned off; and the n-type MOS transistor M5 is turned on and the p-type MOS transistor M6 is turned off. The turning on of the n-type MOS transistors M3 and M5, in turn, turn off the n-type MOS transistor M1 and turn on the p-type MOS transistor M2. The driver circuit $DRV_H$ effectively causes the driver signal to approach the voltage level of the power supply voltage source. This action is similar as to shown in FIG. 5.

The driver circuit $DRV_L$ is comprised of the n-type MOS transistors M1 and M5 and the p-type MOS transistor M6. The sources of the n-type MOS transistors M1 and M5 are connected through the distribution wiring and interconnection network modeled by the parasitic inductor $L_{Vss}$ to the ground reference potential. The gates of the n-type MOS transistor M5 and the p-type MOS transistor M6 are connected together to form the input of the driver circuit $DRV_L$ which is connected to the internal circuits Int Ckt to receive the output signal $V_o$.

The drains of the p-type MOS transistor M6 and the n-type MOS transistor M5 are connected to the gate of the n-type MOS transistor M1. The source of the p-type MOS transistor M6 is connected to the drain of the n-type MOS transistor M1 which together form the output of the driver circuit $DRV_L$.

When the output signal $V_o$ of the internal circuits Int Ckt changes from the second voltage level (5V) to the first voltage level (0V), the p-type MOS transistor M6 is turned on and the n-type MOS transistor M5 is turned off; and the p-type MOS transistor M4 is turned on and the n-type MOS transistor M3 is turned off. The turning on of the p-type MOS transistors M4 and M6, in turn, turn off the p-type MOS transistor M2 and turn on the n-type MOS transistor M1. Turning on the p-type MOS transistor M6 effectively connects the gate of the n-type MOS transistor M1, to its gate, thus effectively configuring the n-type MOS transistor M1 as a diode. The slew rate of the driver signal at the output of the driver circuit $DRV_L$ is thus self-limiting in that when the output voltage approaches within a threshold voltage $(V_T)$ of the n-type MOS transistor M1, the n-type MOS transistor M1 is turned off. The slew rate of the driver signal $V_D$ is self-limiting in that the size of the load capacitance $C_L$ determines the time duration that the n-type MOS transistor M1 remains turned on. A small load capacitance $C_L$ charges more quickly and reaches a voltage level within the threshold voltage of the ground reference potential sooner. Conversely, a larger load capacitance $C_L$ forces the n-type MOS transistor M1 to conduct more current for a longer time.

Figure 13:
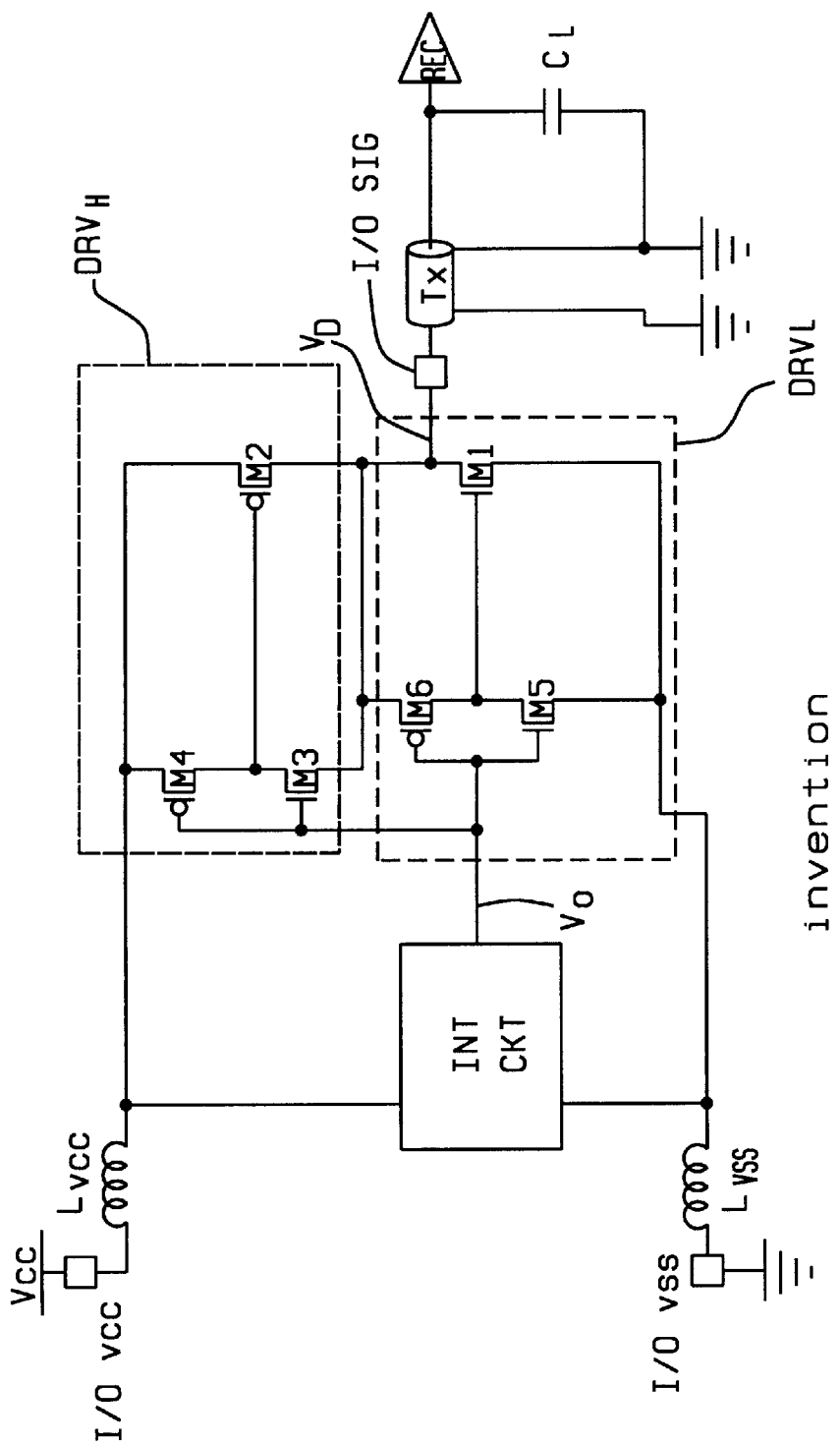
FIG. 13 is a schematic diagram of a second embodiment of the self-limiting driver of this invention within a communication interface.

In a second embodiment of this invention shown in FIG. 13, the source of the n-type MOS transistor M3 is connected to the drain of the p-type MOS transistor M2 which together form the output of the driver circuit $DRV_H$. The second embodiment of this invention makes the driver circuit $DRV_H$ into a self-limiting driver.

When the n-type MOS transistor M3 is configured as the second embodiment shown in FIG. 13, the n-type MOS transistor M3 effectively connects the gate of the p-type MOS transistor M2 to its gate, thus effectively configuring the p-type MOS transistor M2 as a diode. The slew rate of the driver signal $V_D$ at the output of the driver circuit $DRV_H$ is self-limiting in that when the output voltage approaches within a threshold voltage $(V_T)$ of the p-type MOS transistor M2, the p-type MOS transistor M2 is turned off. The slew rate of the driver signal $V_D$ is self-limiting in that the size of the load capacitance $C_L$ determines the time duration that the p-type MOS transistor M2 remains turned on. A small load capacitance $C_L$ charges more quickly and reaches a voltage level within the threshold voltage of the power supply voltage source sooner. Conversely, a larger load capacitance $C_L$ forces the p-type MOS transistor M2 to conduct more current for a longer time.

The driver circuit $DRV_L$ the first embodiment of this invention of FIG. 9 and driver circuits $DRV_L$ of the second embodiment of this invention of FIG. 13 have an advantage over a slew rate controlled driver circuit of the prior art such as shown in FIG. 5 with respect to the amount of $\Delta i$ noise present on the distribution wiring and interconnection network of the ground reference potential.

Figure 10A:
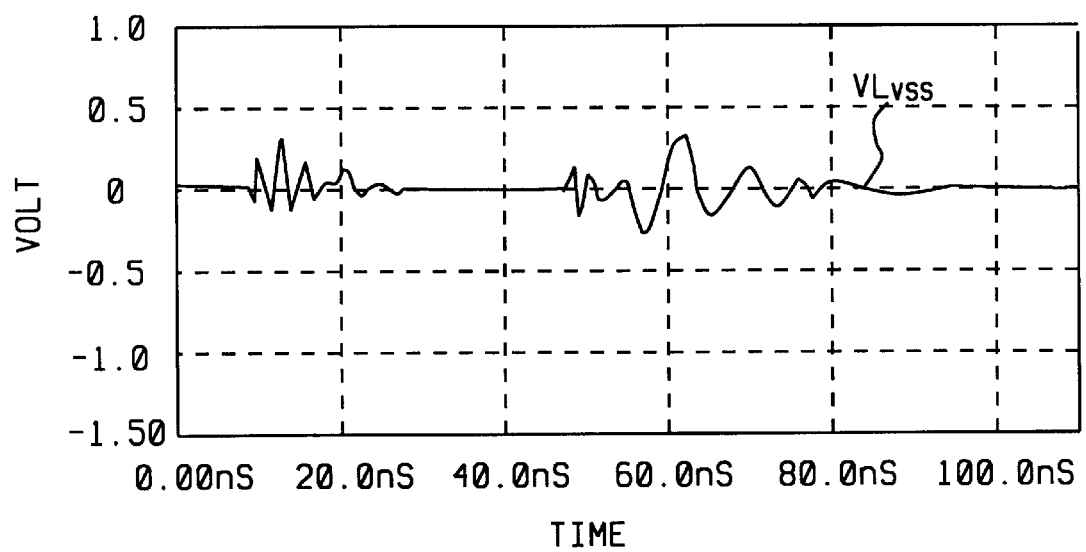
FIGS. 10a and 10b are plots, respectively, of switching noise on the ground reference potential ($V_{ss}$) and the power supply voltage source ($V_{cc}$) of the self-limiting driver of this invention as shown in FIG. 9.

The driver circuit $DRV_H$ of the second embodiment of this invention of FIG. 13 have an advantage over a slew rate controlled driver circuit of the prior art such as shown in FIG. 5 with respect to the amount of $\Delta i$ noise present on the distribution wiring and interconnection network of the power supply voltage source. As soon as the voltage present at the output of the driver circuit $DRV_L$, respectively, approaches the voltage level that is within a threshold voltage $(V_T)$ of the power supply voltage source $(V_{cc})$ or the ground reference potential, the driver MOS transistors M2 or M1 are turned off, thus limiting the current change on the distribution wiring and interconnection network. Limiting this current limits the induced voltages $V_{LVcc}$ or $V_{LVss}$. Refer now to FIG. 10a to examine the level of the voltage $V_{LVss}$ developed across the parasitic inductor $L_{Vss}$. In this instance, the maximum voltage change is less than 250 mV for the single driver. This is compared to a maximum voltage change of approximately 500 mV for the driver of FIG. 5.

Figure 10B:
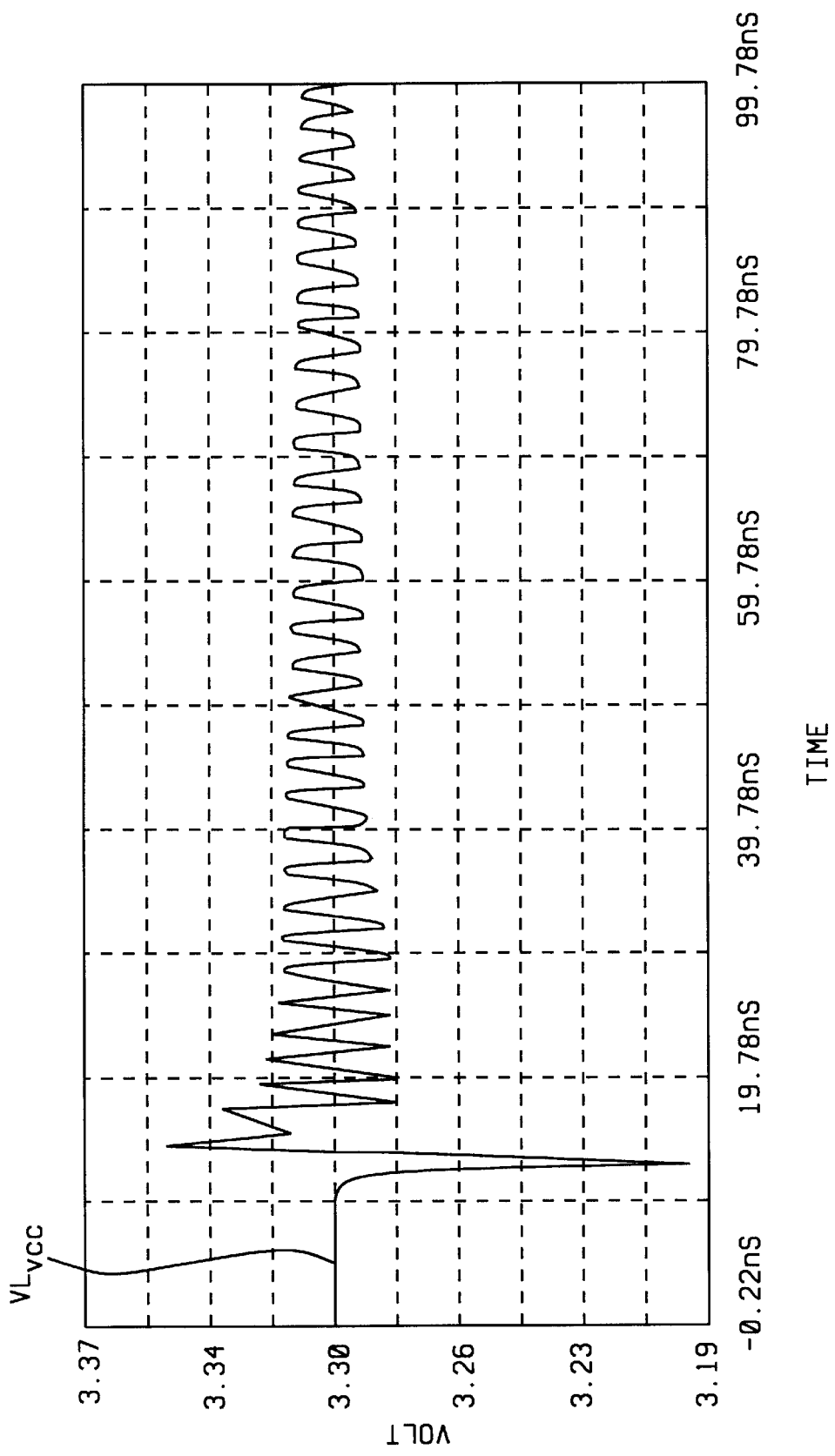

The driver circuit $DRV_H$ of the first embodiment of this invention develops a voltage $V_{LVcc}$ level across the parasitic inductance $L_{Vcc}$ that is generally equivalent to that as shown in FIG. 6b. The voltage $V_{LVcc}$ level across the parasitic inductance $L_{Vcc}$ for the second embodiment of this invention is described in FIG. 10b. In this instance, the maximum voltage change is approximately 140 mV. This is compared to a maximum voltage change of approximately 600 mV for the driver circuit of FIG. 5 as shown in FIG. 6b.

Figure 11:
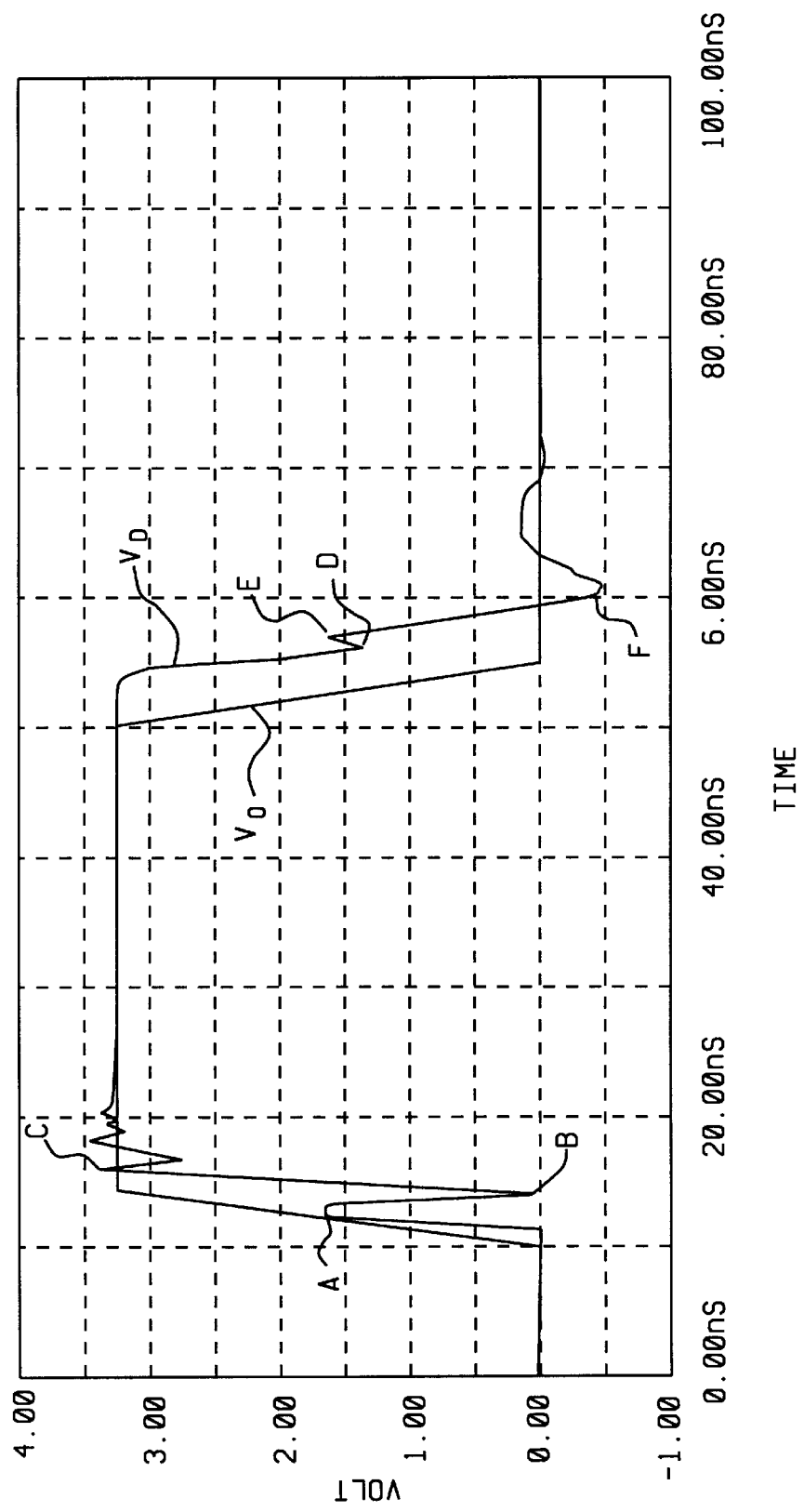
FIG. 11 is a plot of the output signal of the internal circuits and the driver signal at the near end of the transmission line of the self-limiting driver of this invention as shown in FIG. 9.

Refer now to FIG. 11 to examine the output signal $V_O$, and in response to the output signal $V_O$, the driver signal $V_D$ at the near end of the transmission line $T_x$ at the output end of the complementary driver.

When the output signal $V_O$ changes from the first voltage level (0V) to the second voltage level $(V_{cc})$, the driver signal $V_D$ rises to the level at point A of the driver signal $V_D$. This voltage level, as described above, is the voltage division of the voltage drop across the p-type MOS transistor M2 and the characteristic impedance $Z_0$ of the transmission line $T_x$. The returning reflection from the load capacitance $C_L$ is shown at point B of the driver signal $V_D$. The driver signal $V_D$ increases from the level at point B of the driver signal $V_D$ to the level at point C of the driver signal $V_D$ as the transmission line is brought to the voltage level of the power supply voltage source $V_{cc}$.

When the output signal $V_O$ changes from the second voltage level $(V_{cc})$ to the first voltage level (0V), the driver signal $V_D$, in response, falls to the voltage level of point D. The voltage level of point D of the driver signal $V_D$ now is the voltage level determined by the voltage divider of the n-type MOS transistor M1 and the characteristic impedance $Z_0$ of the transmission line $T_x$. The first reflection is the voltage level at point E of the driver signal $V_D$. The driver signal $V_O$ then decreases toward the first voltage level (0V). When the driver signal $V_D$ approaches within a threshold of the n-type MOS transistor M1, the n-type MOS transistor M1 turns off and the transmission line $T_x$ appears unterminated and the driver signal $V_D$ approaches the first voltage level (0V) at point F.

Figure 12:
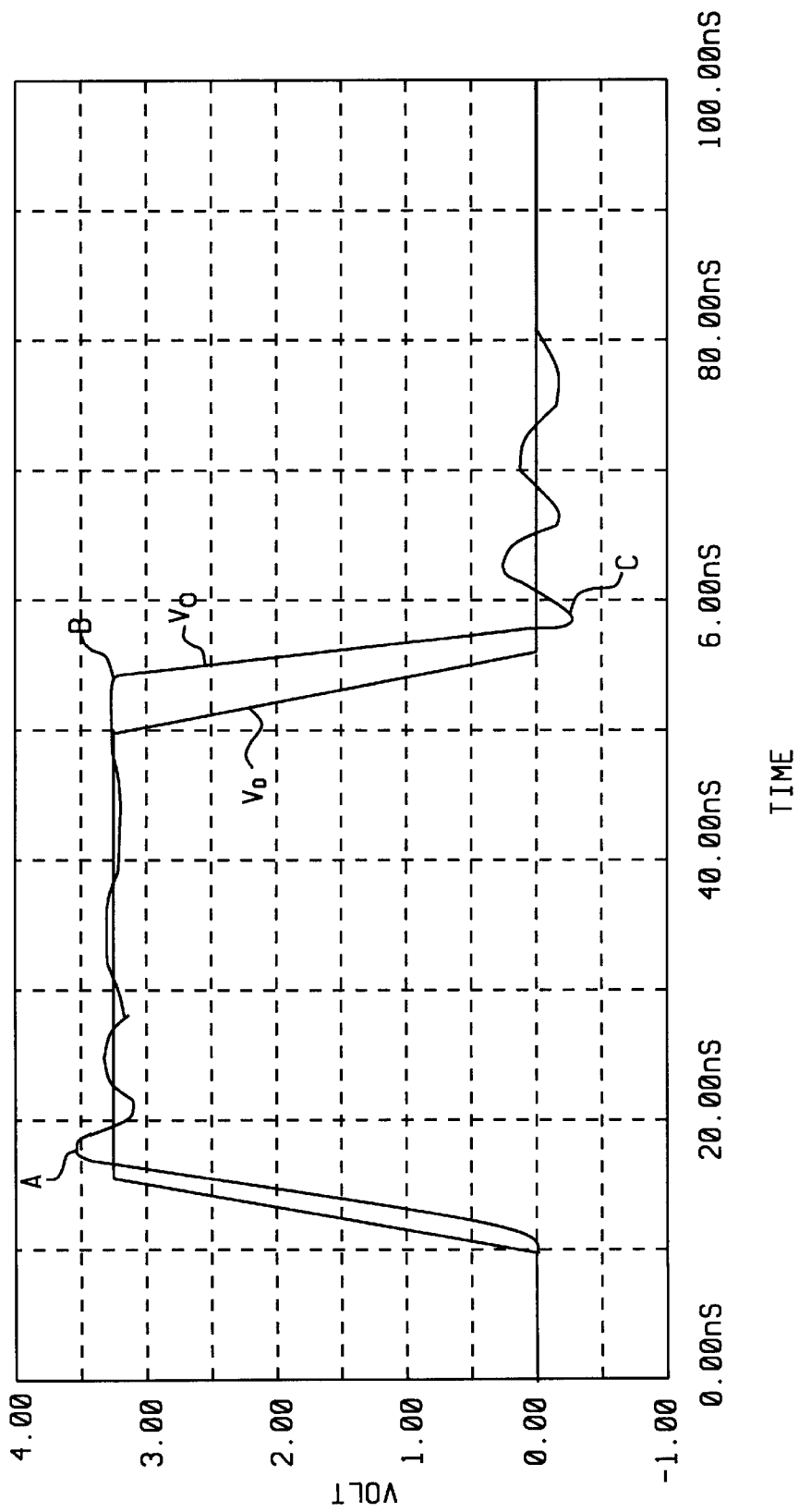
FIG. 12 is a plot of the output signal of the internal circuits and the driver signal at the far end of the transmission line of the self-limiting driver of this invention as shown in FIG. 9.

Refer now to FIG. 12 to examine the output signal $V_O$, and in response to the output signal $V_O$, the driver signal $V_D$ at the far end of the transmission line $T_x$ at the input of the receiver.

When the output signal $V_O$ changes from the first voltage level (0V) to the second voltage level $(V_{cc})$, the driver signal $V_O$ rises to the level at point A of the driver signal $V_D$. This voltage level, as described above, is the result of the doubling of the incident wavefront of the driver signal "bouncing" or reflecting from the unterminated receiver. There is minimal "ringing" or damped self-oscillation due to reflections since the p-type MOS transistor M2 has turned off and both ends of the transmission line $T_x$ are unterminated.

The individual reflections on the transmission line cause the voltage level of the driver signal $V_D$ to rise to point B at the voltage level of the power supply voltage source $V_{cc}$.

When the output signal $V_O$ changes from the second voltage level ($V_{cc}$) to the first voltage level (0V), the driver signal $V_D$, in response, falls to the voltage level of point C. This now is the first voltage level (0V) as determined by the doubling of the negative going incident wavefront of the driver signal arriving at the unterminated receiver input. As before described, the n-type MOS transistor M1 turns off and the transmission line appears unterminated at the near and far ends.

Figure 14:
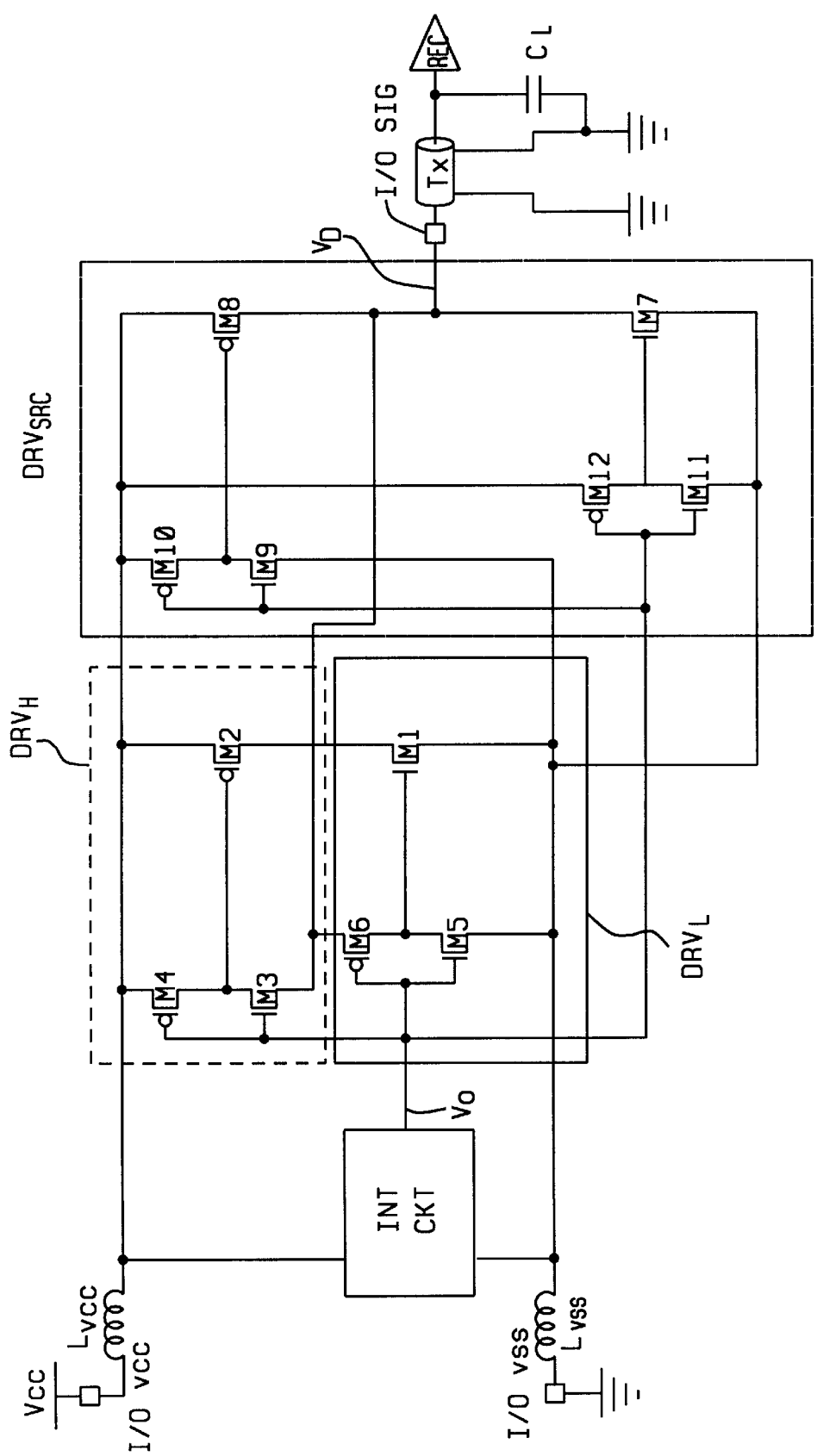
FIG. 14 is a schematic diagram of a third embodiment of the self-limiting driver of this invention within a communication interface.

Circuits incorporating receivers that have complementary MOS transistors in the input stage do not require sink or source steady state or D.C. current to the output terminal of the driver. However, designs incorporating terminating resistors or those that have bipolar junction transistors such as in transistor-transistor logic (TTL) require a level of D.C. current to operate correctly. Refer to FIG. 14 to discuss a third embodiment of this invention that can provide the self-limiting features described above and provide a steady state D.C. current. This embodiment contains the complementary driver configured with the basic driver circuits $DRV_H$ and $DRV_L$ as described in FIG. 9. A slew rate controlled driver $DRV_{SRC}$, as described in FIG. 5, is placed in parallel with the complementary driver. The transistors M7, M8, M9, M10, M11, and M12 respectively correspond with the transistors M1, M2, M3, M4, M5, and M6 of the slew rate controlled driver described in FIG. 5. The output signal $V_O$ of the internal circuits Int Ckt is simultaneously the input to the complementary driver and the slew rate controlled driver $DRV_{SRC}$.

Figure 15:
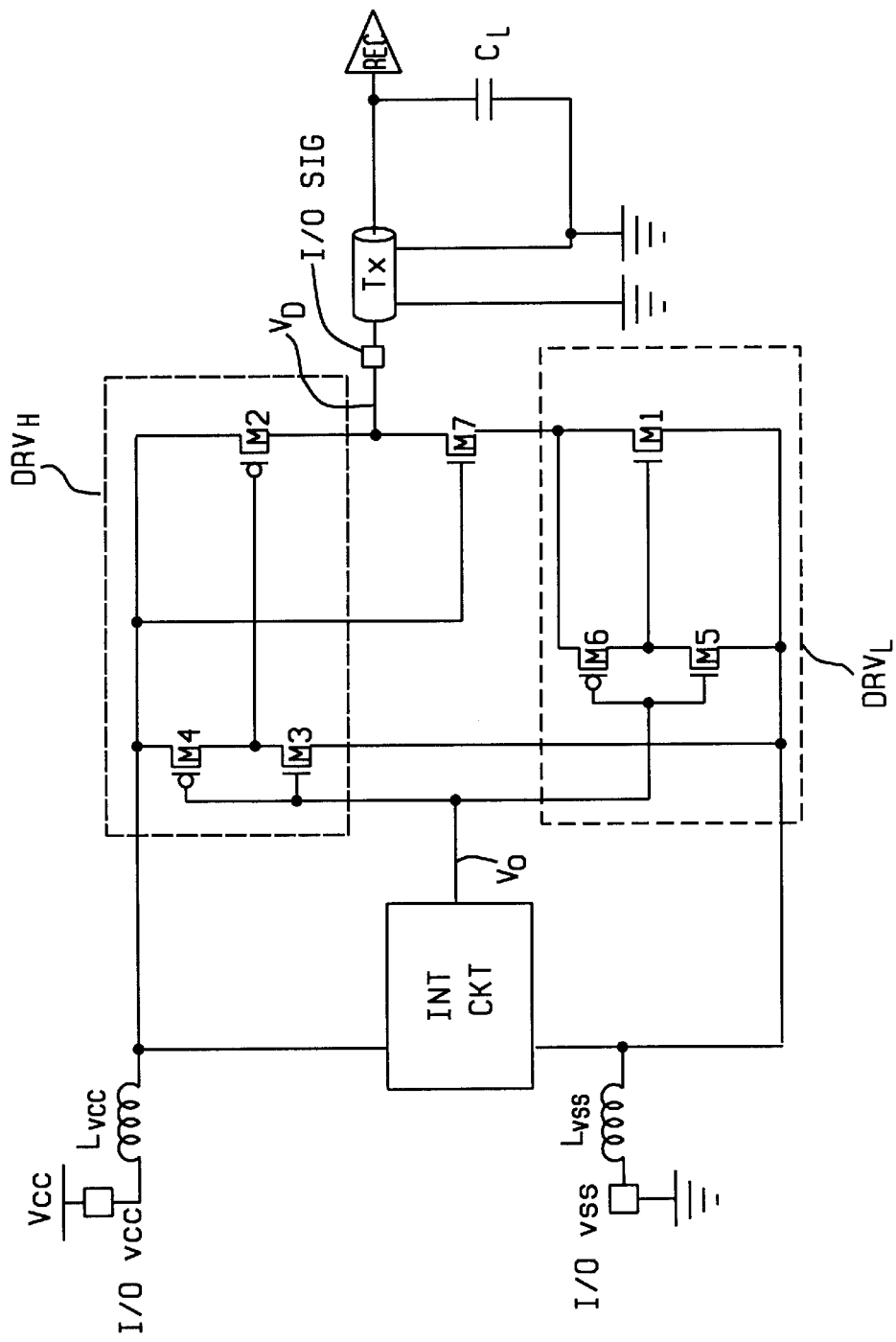
FIG. 15 is a schematic diagram of a fourth embodiment of the self-limiting driver of this invention within a communication interface.

The application of the self-limiting driver of this invention is generally in a communication interface that uses a low voltage swing. However, certain of the communication interfaces have high voltage swings. Refer now to FIG. 15 for a description of a fourth embodiment of this invention. The structure of the basic driver circuits $DRV_H$ and $DRV_L$ are as described in FIG. 9. The n-type MOS transistor M71 is placed between the output of the basic driver $DRV_L$ and the transmission line $T_x$. The source of the n-type MOS transistor M71 is connected to the drains of the n-type MOS transistor M1 and the p-type MOS transistor M6. The drain is connected to the near end of the transmission line $T_x$. N-type MOS transistor M71 is configured in a cascode arrangement with N-type MOS transistor M1. The gate of the n-type MOS transistor M71 is connected to the power supply voltage source $V_{cc}$. Transistor.

While this invention has been particularly shown and described with reference to the preferred embodiments thereof, it will be understood by those skilled in the art that various changes in form and details may be made without departing from the spirit and scope of the invention.

The invention claimed is:

1. A self-limiting driver circuit within an integrated circuit for driving a transmission line comprising:
   limiting means responsive to an output signal from an internal circuit; and
   driving means responsive to the limiting means for providing a drive signal to an output terminal, wherein the limiting means is responsive to the driving means for controlling a slew rate of the driving means and for disabling the driving means when the output signal approaches a threshold of the driving means,
   wherein the driving means comprises:
      a first transistor of a first conductivity type with a first terminal arranged to receive an output of the limiting means, a second terminal to output the drive signal to the output terminal, and a third terminal in communication with a first reference voltage source,
      a second transistor of a second conductivity type with a fourth terminal arranged to receive an output of the limiting means, a fifth terminal to output the drive signal to the output terminal, and a sixth terminal in communication with a second reference voltage source,
   wherein the limiting means comprises:
      a third transistor of the first conductivity type having a seventh terminal in communication with the first terminal of said first transistor; an eighth terminal in communication with the internal circuit; and a ninth terminal in communication with the first reference voltage source; and
      a fourth transistor of the second conductivity type having a tenth terminal in communication with the second terminal of the first transistor, an eleventh terminal communication with the internal circuit to receive the output signal, and a twelfth terminal communication with the seventh terminal of the third transistor and the first terminal of the first transistor such that when the output signal activates the driving means, the driving means is functioning as a diode until the drive signal achieves the threshold level of the driving means at which time the driving means is disabled,
      a fifth transistor of the second conductivity type having a thirteenth terminal in communication with the fourth terminal of said second transistor; a fourteenth terminal in communication with the internal circuit; and a fifteenth terminal in communication with the second reference voltage source; and
      a sixth transistor of the first conductivity type having a sixteenth terminal connected to the fifth terminal of the second transistor and the tenth terminal of the fourth transistor, a seventeenth terminal in communication with the internal circuit to receive the output signal, and an eighteenth terminal in communication with the thirteenth terminal of the fifth transistor and the fourth terminal of the second transistor such that when the output signal activates the driving means, the driving means is functioning as a diode until the drive signal achieves the threshold level of the driving means at which time the driving means is disabled.

2. The self-limiting driver circuit of claim 1 wherein the first, second, third, fourth, fifth and sixth transistors each comprises a MOS transistor.

3. A self-limiting driver circuit within an integrated circuit for driving a transmission line comprising:
   first driving means for providing a drive signal of a first polarity to an output terminal, wherein said first driving means is arranged between the output terminal and a first reference voltage;
   second driving means for providing a drive signal of a second polarity to the output terminal, wherein said second driving means is arranged between the output terminal and a second reference voltage;
   first limiting means responsive to an output signal from an internal circuit for controlling a slew rate of said first driving means and for disabling said first driving means when the output signal approaches a threshold of said first driving means; and
   second limiting means responsive to an output signal from the internal circuit for controlling a slew rate of said second driving means and for disabling said second driving means when the output signal approaches a threshold of said second driving means;

wherein said first driving means is responsive to the first limiting means;

wherein said second driving means is responsive to the second limiting means;

wherein said first limiting means is arranged between the first reference voltage and said second limiting means;

wherein said second limiting means is arranged between the second reference voltage and said first limiting means;

wherein an output said first limiting means is arranged communication with a control terminal of said first driving means; and wherein an output said second limiting means is arranged communication with a control terminal of said second driving means.

4. The self-limiting driver circuit of claim 3 further comprising a cascode driving means arranged between the first and second driving means and the output terminal to limit any high voltage at the output terminal.

5. A self-limiting driver circuit within an integrated circuit for driving a transmission line comprising:

driving means for providing a drive signal to an output terminal comprising a limiting means responsive to an output signal from an internal circuit; wherein the limiting means is responsive to the driving means for controlling a slew rate of the driving means and for disabling the driving means when the output signal approaches a threshold of the driving means; and current driving means arranged in parallel with the driving means to also receive the output signal form the internal circuit and in response to the output signal providing a path to source or sink current from the output terminal, wherein the driving means comprises:
a first transistor of a first conductivity type with a first terminal arranged to receive an output of the limiting means, a second terminal to output the drive signal to the output terminal, and a third terminal in communication with a first reference voltage source,
a second transistor of a second conductivity type with a fourth terminal arranged to receive an output of the limiting means, a fifth terminal to output the drive signal to the output terminal, and a sixth terminal in communication with a second reference voltage source, wherein the limiting means comprises:
a third transistor of the first conductivity type having a seventh terminal in communication with the first terminal of said first transistor; an eighth terminal in communication with the internal circuit; and a ninth terminal in communication with the first reference voltage source; and
a fourth transistor of the second conductivity type having a tenth terminal in communication with the second terminal of the first transistor, an eleventh terminal communication with the internal circuit to receive the output signal, and a twelfth terminal communication with the seventh terminal of the third transistor and the first terminal of the first transistor such that when the output signal activates the driving means, the driving means is functioning as a diode until the drive signal achieves the threshold level of the driving means at which time the driving means is disabled,
a fifth transistor of the second conductivity type having a thirteenth terminal in communication with the fourth terminal of said second transistor; a fourteenth terminal in communication with the internal circuit; and a fifteenth terminal in communication with the second reference voltage source; and
a sixth transistor of the first conductivity type having a sixteenth terminal connected to the fifth terminal of the second transistor and the tenth terminal of the fourth transistor, a seventeenth terminal in communication with the internal circuit to receive the output signal, and an eighteenth terminal in communication with the thirteenth terminal of the fifth transistor and the fourth terminal of the second transistor such that when the output signal activates the driving means, the driving means is functioning as a diode until the drive signal achieves the threshold level of the driving means at which time the driving means is disabled.

6. A self-limiting driver circuit within an integrated circuit for driving a transmission line comprising:

limiter circuit responsive to an output signal from an internal circuit; and driver circuit responsive to the limiter circuit to provide a drive signal to an output terminal, wherein the limiter circuit is responsive to the driver circuit for controlling a slew rate of the driver circuit and to disable the driver circuit when the output signal approaches a threshold of the driver circuit, wherein the driver circuit comprises:
a first transistor of a first conductivity type with a first terminal arranged to receive an output of the limiter circuit, a second terminal to output the drive signal to the output terminal, and a third terminal in communication with a first reference voltage source,
a second transistor of a second conductivity type with a fourth terminal arranged to receive an output of the limiter circuit, a fifth terminal to output the drive signal to the output terminal, and a sixth terminal in communication with a second reference voltage source, wherein the limiter circuit comprises:
a third transistor of the first conductivity type having a seventh terminal in communication with the first terminal of said first transistor; an eighth terminal in communication with the internal circuit; and a ninth terminal in communication with the first reference voltage source; and
a fourth transistor of the second conductivity type having a tenth terminal in communication with the second terminal of the first transistor, an eleventh terminal communication with the internal circuit to receive the output signal, and a twelfth terminal communication with the seventh terminal of the third transistor and the first terminal of the first transistor such that when the output signal activates the driver circuit, the driver circuit is functioning as a diode until the drive signal achieves the threshold level of the driver circuit at which time the driver circuit is disabled,
a fifth transistor of the second conductivity type having a thirteenth terminal in communication with the fourth terminal of said second transistor; a fourteenth terminal in communication with the internal circuit; and a fifteenth terminal in communication with the second reference voltage source; and
a sixth transistor of the first conductivity type having a sixteenth terminal connected to the fifth terminal of the second transistor and the tenth terminal of the fourth transistor, a seventeenth terminal in communication with the internal circuit to receive the output signal, and an eighteenth terminal in communication with the thirteenth terminal of the fifth transistor and the fourth terminal of the second transistor such that when the output signal activates the driver circuit, the driver circuit is functioning as a diode until the drive signal achieves the threshold level of the driver circuit at which time the driver circuit is disabled.

7. The self-limiting driver circuit of claim 6 wherein the first, second, third, fourth, fifth and sixth transistors each comprises a MOS transistor.

8. A self-limiting driver circuit within an integrated circuit for driving a transmission line comprising:

first driver circuit to provide a drive signal of a first polarity to an output terminal, wherein said first driver circuit is arranged between the output terminal and a first reference voltage;

second driver circuit to provide a drive signal of a second polarity to the output terminal, wherein said second driver circuit is arranged between the output terminal and a second reference voltage;

first limiter circuit responsive to an output signal from an internal circuit to control a slew rate of said first driver circuit and to disable said first driver circuit when the output signal approaches a threshold of said first driver circuit; and second limiter circuit responsive to an output signal from the internal circuit to control a slew rate of said second driver circuit and to disable said second driver circuit when the output signal approaches a threshold of said second driver circuit;

wherein said first driver circuit is responsive to the first limiter circuit;

wherein said second driver circuit is responsive to the second limiter circuit;

wherein said first limiter circuit is arranged between the first reference voltage and said second limiter circuit;

wherein said second limiter circuit is arranged between the second reference voltage and said first limiter circuit;

wherein an output said first limiter circuit is arranged communication with a control terminal of said first driver circuit; and wherein an output said second limiter circuit is arranged communication with a control terminal of said second driver circuit.

9. The self-limiting driver circuit of claim 6 further comprising a cascode driver circuit arranged between the first and second driver circuits and the output terminal means to limit any high voltage at the output terminal.

10. A self-limiting driver circuit within an integrated circuit for driving a transmission line comprising:

driver circuit to provide a drive signal to an output terminal comprising a limiter circuit responsive to an output signal from an internal circuit; wherein the limiter circuit is responsive to the driver circuit to control a slew rate of the driver circuit and to disable the driver circuit when the output signal approaches a threshold of the driver circuit; and current driver circuit arranged in parallel with the driver circuit to also receive the output signal from the internal circuit and in response to the output signal providing a path to source or sink current from the output terminal wherein the driver circuit comprises:

a first transistor of a first conductivity type with a first terminal arranged to receive an output of the limiter circuit, a second terminal to output the drive signal to the output terminal, and a third terminal in communication with a first reference voltage source, a second transistor of a second conductivity type with a fourth terminal arranged to receive an output of the limiter circuit, a fifth terminal to output the drive signal to the output terminal, and a sixth terminal in communication with a second reference voltage source, wherein the limiter circuit comprises:

a third transistor of the first conductivity type having a seventh terminal in communication with the first terminal of said first transistor; an eighth terminal in communication with the internal circuit; and a ninth terminal in communication with the first reference voltage source; and a fourth transistor of the second conductivity type having a tenth terminal in communication with the second terminal of the first transistor, an eleventh terminal communication with the internal circuit to receive the output signal, and a twelfth terminal communication with the seventh terminal of the third transistor and the first terminal of the first transistor such that when the output signal activates the driver circuit, the driver circuit is functioning as a diode until the drive signal achieves the threshold level of the driver circuit at which time the driver circuit is disabled, a fifth transistor of the second conductivity type having a thirteenth terminal in communication with the fourth terminal of said second transistor; a fourteenth terminal in communication with the internal circuit; and a fifteenth terminal in communication with the second reference voltage source; and a sixth transistor of the first conductivity type having a sixteenth terminal connected to the fifth terminal of the second transistor and the tenth terminal of the fourth transistor, a seventeenth terminal in communication with the internal circuit to receive the output signal, and an eighteenth terminal in communication with the thirteenth terminal of the fifth transistor and the fourth terminal of the second transistor such that when the output signal activates the driver circuit, the driver circuit is functioning as a diode until the drive signal achieves the threshold level of the driver circuit at which time the driver circuit is disabled.

* * * * *